(12) United States Patent
Chen et al.

(10) Patent No.: US 6,471,536 B1
(45) Date of Patent: Oct. 29, 2002

(54) ZERO INSERTION FORCE SOCKET HAVING MECHANICAL FASTENING DEVICE

(75) Inventors: Sen-Jong Chen, Tu-Chen (TW); Genn-Sheng Lee, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/027,709

(22) Filed: Dec. 19, 2001

(51) Int. Cl.[7] .................................................. H01R 4/50
(52) U.S. Cl. ....................................... 439/342; 439/259
(58) Field of Search ................................ 439/342, 331, 439/330, 259–266, 68

(56) References Cited

U.S. PATENT DOCUMENTS

| | | | |
|---|---|---|---|
| 5,147,213 A | * 9/1992 | Funk et al. | 439/342 |
| 5,254,012 A | * 10/1993 | Wang | 439/342 |
| 6,287,137 B1 | * 9/2001 | Nada et al. | 439/342 |
| 6,368,137 B1 | * 4/2002 | Orwell | 439/331 |

* cited by examiner

*Primary Examiner*—Hien Vu
(74) *Attorney, Agent, or Firm*—WeiTe Chung

(57) ABSTRACT

A ZIF socket includes a base (10), a cover (12) slidably mounted on the base, a plurality of terminals (19) received in the base, a lever (20) driving the cover to move along the base, and a fastening device (14; 16; 17). The fastening device has a securing portion (146; 166; 176) secured to the base, a neck portion (144; 164; 174) movably received in an elongated hole (125) of the cover, and an elongated head portion (143; 163; 173) abutting against a supporting surface (124) of the cover in which the elongated hole is defined, thereby fastening the cover and the base together in a vertical direction.

5 Claims, 7 Drawing Sheets

US 6,471,536 B1

ZERO INSERTION FORCE SOCKET HAVING MECHANICAL FASTENING DEVICE

BACKGROUND OF THE INVENTION

1. Field of the Invention

The present invention relates to a Zero Insertion Force (ZIF) socket, and particularly to a ZIF socket having a fastening device for fastening a cover and a base of the ZIF socket.

2. Description of Prior Art

Referring to FIGS. 11 and 12, U.S. Pat. No. 5,722,848 discloses a conventional ZIF socket 3, a cover 32 of which provides a retention device 321 integrally formed thereon and a base 30 of which provides a restriction device 301 to cooperate with the retention device 321. Both the retention device 321 and the restriction device 301 are disposed adjacent to a cam shaft 341 of a lever 34 for efficiently fastening the cover 32 and the base 30. The retention device 321 is configured in an L-shape, and includes a vertical section 322 and a horizontal hook section 323 engaging with a restriction plane 302 of the restriction device 301 to fasten the cover 32 and the base 30 together. However, when the socket 3 is in an open position, the engagement area between the horizontal hook section 323 and the restriction plane 302 is too small to assure a reliable engagement therebetween, thereby resulting in a loose engagement between the cover 32 and the base 30. Furthermore, even if the engagement between the retention device 321 and the restriction device 301 prevents the cover 321 from disengaging from the base 30 in a vertical direction, the resistance force acting on a neck portion 324 of the retention device 321 may make the hook portion 323 break, thereby resulting in a disengagement between the cover 32 and the base 30 at a rear portion proximate to the lever 34.

Hence, a ZIF socket having an improved fastening device is required to overcome the disadvantages of the prior art.

BRIEF SUMMARY OF THE INVENTION

One object of the present invention is to provide a ZIF socket with a fastening device which can firmly fasten a cover and a base of the ZIF socket.

The other object of the present invention is to provide a ZIF socket with a fastening device which simplifies manufacturing process and assembling of the ZIF socket.

A ZIF socket in accordance with the present invention includes a base defining a plurality of passageways extending vertically therethrough, a cover slidably attached to the base, a plurality of terminals received in corresponding passageways of the base, a lever assembled between the base and the cover for driving the cover to move along the base, and a fastening device. The fastening device has a securing portion secured to the base, a neck portion and a head portion movably engaging with the cover, thereby fastening the cover and the base together in a vertical direction. The cover defines an elongated hole in a supporting surface thereof for receiving the neck portion therein. The head portion is larger than the width of the elongated hole to abut against the supporting surface. The fastening device can be a nail, a screw, and a round pin. The difference between the three kinds of fastening device is the manner the fastening device being secured to the base. Alternatively, the securing portion of the fastening device could also be secured to the cover, and the neck portion and the head portion movably engage with the base correspondingly, the function of which is unchanged.

Other objects, advantages and novel features of the invention will become more apparent from the following detailed description of the present embodiment when taken in conjunction with the accompanying drawings.

DETAILED DESCRIPTION OF THE INVENTION

Figure 1:
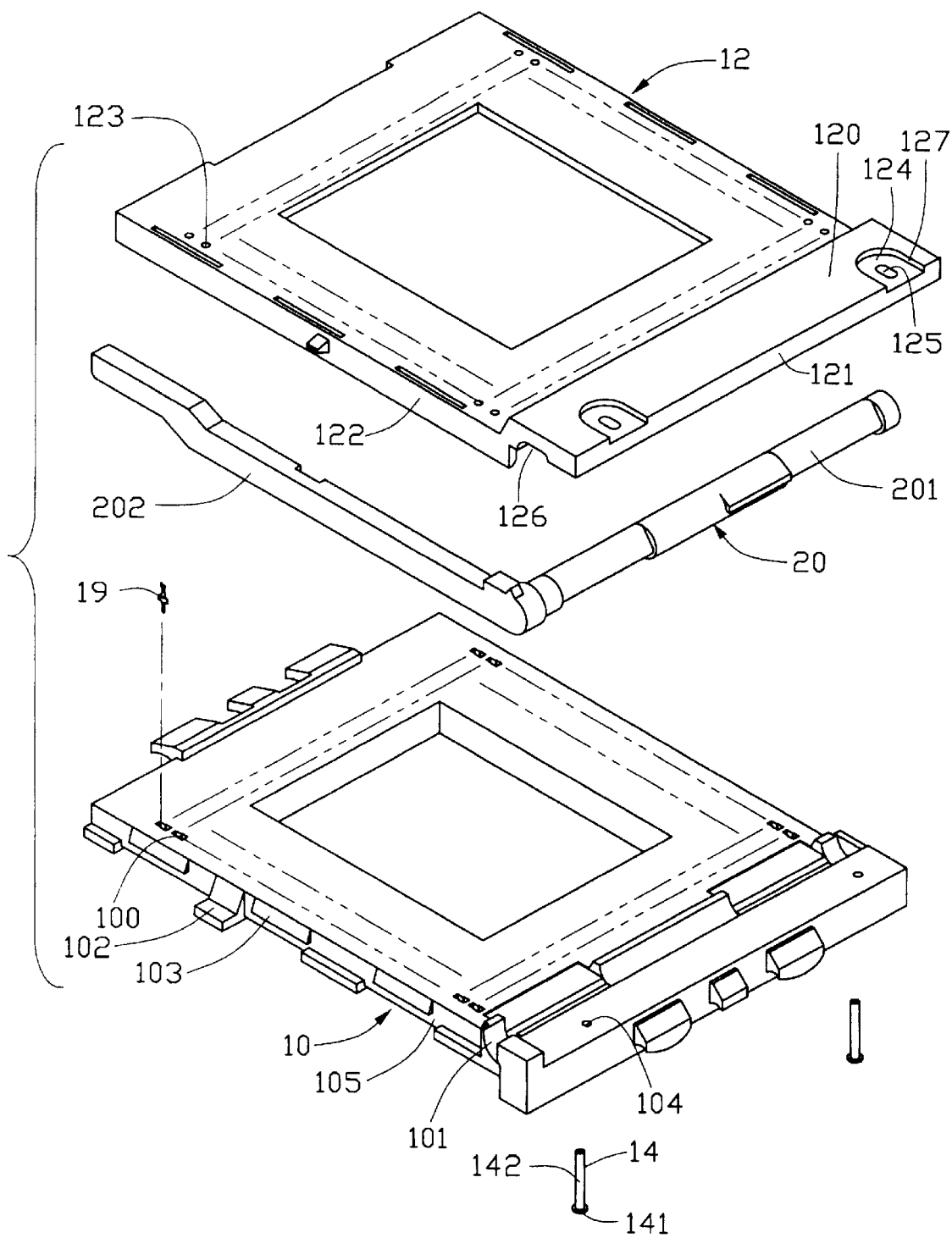
FIG. 1 is an exploded perspective view of a ZIF socket in accordance with a first embodiment of the present invention with a pair of fastening devices separated therefrom.

Referring to FIG. 1, a Zero Insertion Force (ZIF) socket 1 in accordance with a first embodiment of the present invention includes a base 10 defining a plurality of passageways 100 vertically extending therethrough, a cover 12 slidably mounted on the base 10 and defining a plurality of through-holes 123 therein in alignment with corresponding passageways 100 of the base 10 for allowing pins of a Central Processing Unit (CPU) (not shown) to extend into the passageways 100 therethrough, and a plurality of terminals 19 received in the corresponding passageways 100 of the base 10 for electrical connection with the pins of the CPU.

The ZIF socket also has a lever 20 for driving the cover 12 to move along the base 10, which comprises a cam shaft 201 and a handle 202 vertical to the cam shaft 201. The cam shaft 201 of the lever 20 is received in a channel of the ZIF socket which comprises an upper half channel 126 defined in the cover 12 and a lower half channel 101 defined in the base 10. The handle 202 of the lever 20 is positioned on a lateral side 105 of the base 10 and supported by a supporting block 102 integrally formed on the lateral side 105. The details of the lever 20 and the channel may be referred to the similar structures disclosed in U.S. Pat. No. 5,489,218. A plurality of projections 103 project from opposite lateral sides 105 of the base 10 for engaging with corresponding protrusions (not shown) formed on inner sides of side walls 122 of the cover 12.

The ZIF socket further comprises a pair of fastening devices attached thereto to prevent the cover 12 from disengaging from the base 10 in a vertical direction. The pair of fastening devices in this first embodiment are a pair of round pins 14 prior to assembly to the cover 12 and the base 10, each of which has an alignment column 142 and a cap 141 integrally riveted at a lower end of the alignment column 142.

The cover 12 defines a pair of elongated holes 125 in respective supporting surfaces 124 thereof which are lower than a top face 120 of the cover 12. A pair of cutouts 127 are defined in the top face 120, and each supporting surface 124 is formed at the bottom of the cutout 127. Corresponding to the pair of elongated holes 125, two holes 104 are defined through the base 10. Most portion of the alignment column 142 is tightly received in the corresponding hole 104 of the base 10.

Figure 2:
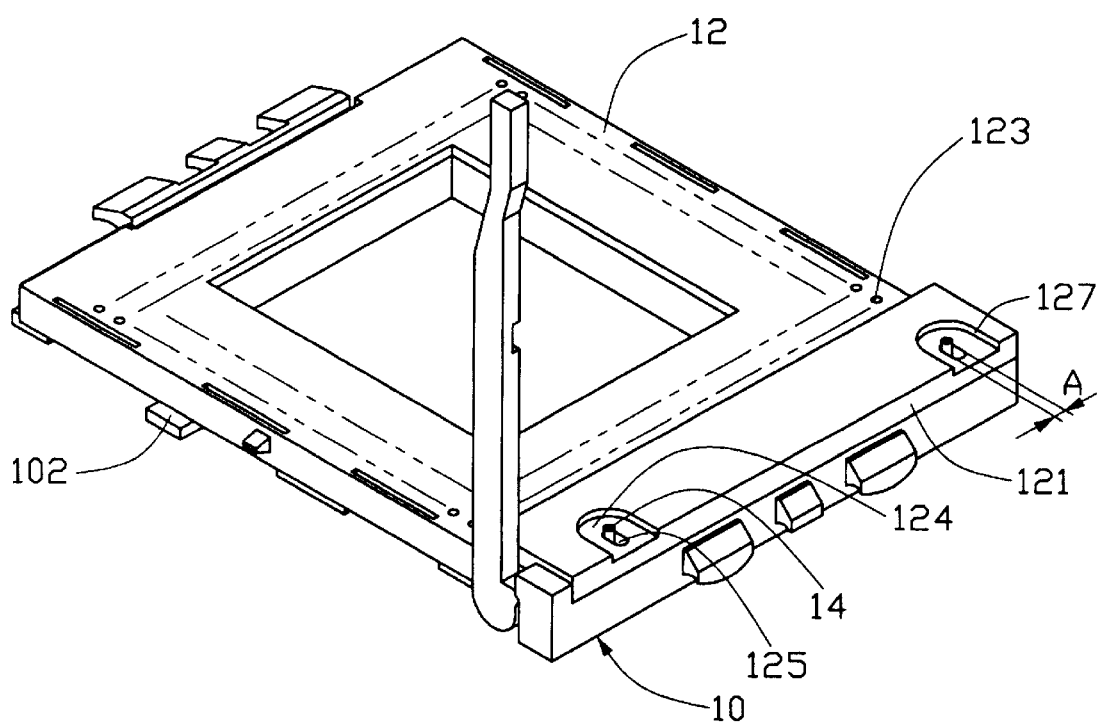
FIG. 2 is an assembled perspective view of the ZIF socket shown in FIG. 1 in an open state, with the pair of fastening devices being detachably attached thereto.

In assembly, referring to FIG. 2, firstly, the cam shaft 201 of the lever 20 is positioned in the lower channel 101 of the base 10, and then the cover 12 is placed on the base 10. The pair of round pins 14 are inserted into the elongated holes 125 of the cover 12 through the corresponding holes 104 in the base 10, whereby the caps 141 of the round pins 14 abut against a lower face 106 (FIG. 4) of the base 10 and the alignment columns 142 are fixedly secured in the corresponding holes 104 of the base 10. Simultaneously, an upper end of the alignment column 142 of the round pin 14 is exposed in the cutout 127.

Figure 3:
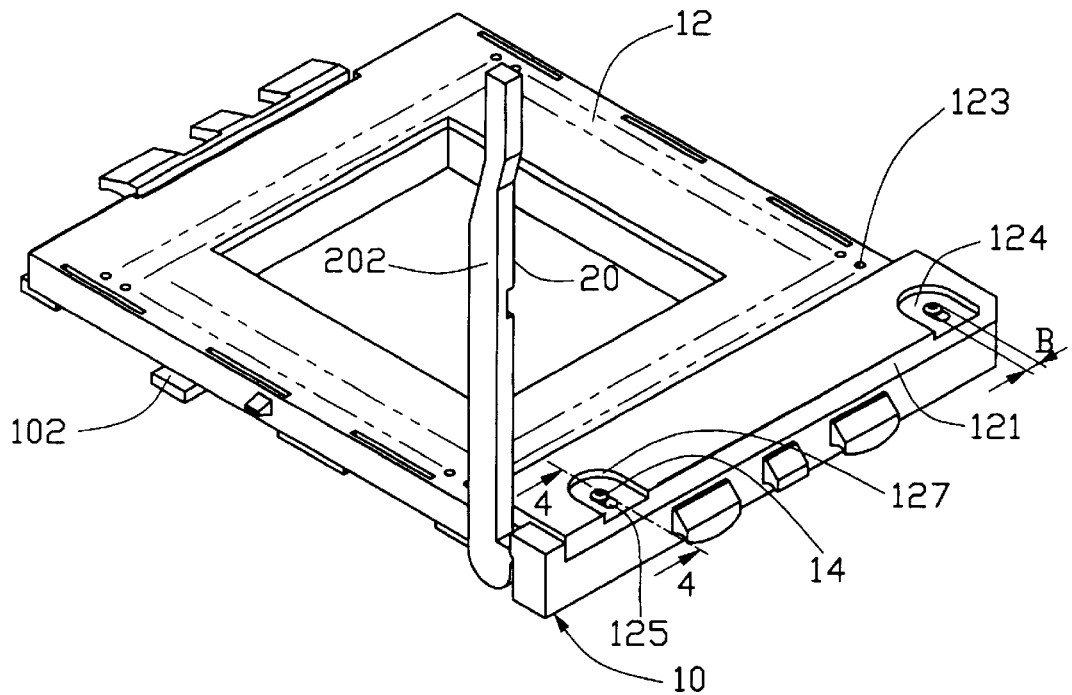
FIG. 3 is a view similar to FIG. 2, but with the pair of fastening devices being riveted thereon.

FIG. 3 illustrates a similar structure and a same state of the ZIF socket shown in FIG. 2. The only difference between FIG. 2 and FIG. 3 is that the upper ends of the round pins 14 exposed in the cutouts 127 of the cover 12 are riveted to form a head portion 143, thereby connecting the cover 12 and the base 10 firmly in a vertical direction. It can be seen that a width B of the head portion 143 of the round pin 14 is larger than a width A of the elongated hole 125 (FIG. 2) for preventing upward movement of the cover 12 relative to the base 10.

Figure 4:
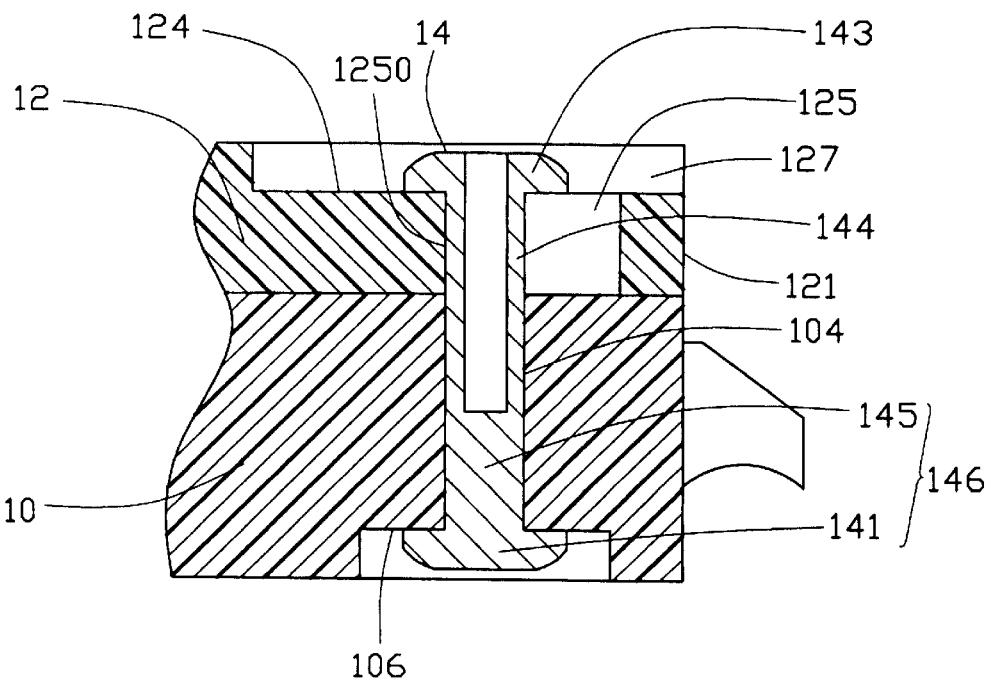
FIG. 4 is a partial, enlarged, cross-sectional view of the ZIF socket taken along line 4—4 of FIG. 3.

FIG. 4 illustrates the positional relation between the round pin 14 and the cover 12 and the base 10 when the ZIF socket is in an open state. The head portion 143 is received in the cutout 127 and engages with the supporting surface 124. The portion of the round pin 14 between the head portion 143 and the cap 141 includes an upper section 144 engaged with a rear inner side 1250 of the elongated hole 125 away from a front face 121 of the cover 12, and a lower section 145 secured in the hole 104 of the base 10. The upper section 144 is movably received in the elongated hole 125 in a direction opposite to the moving direction of the cover 12 and is defined as a neck portion. The lower section 145 and the cap 141 together define a securing portion 146 secured in the base 10.

Figure 5:
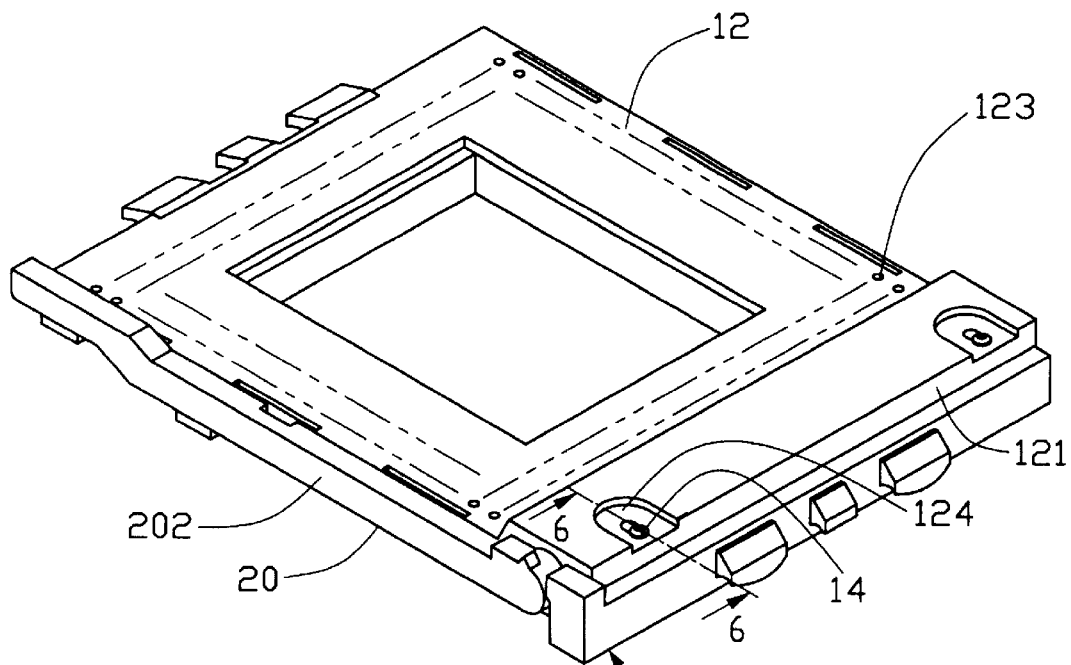
FIG. 5 is an assembled perspective view of the ZIF socket shown in FIG. 1 in a closed state, with the pair of fastening devices being riveted thereon.
Figure 6:
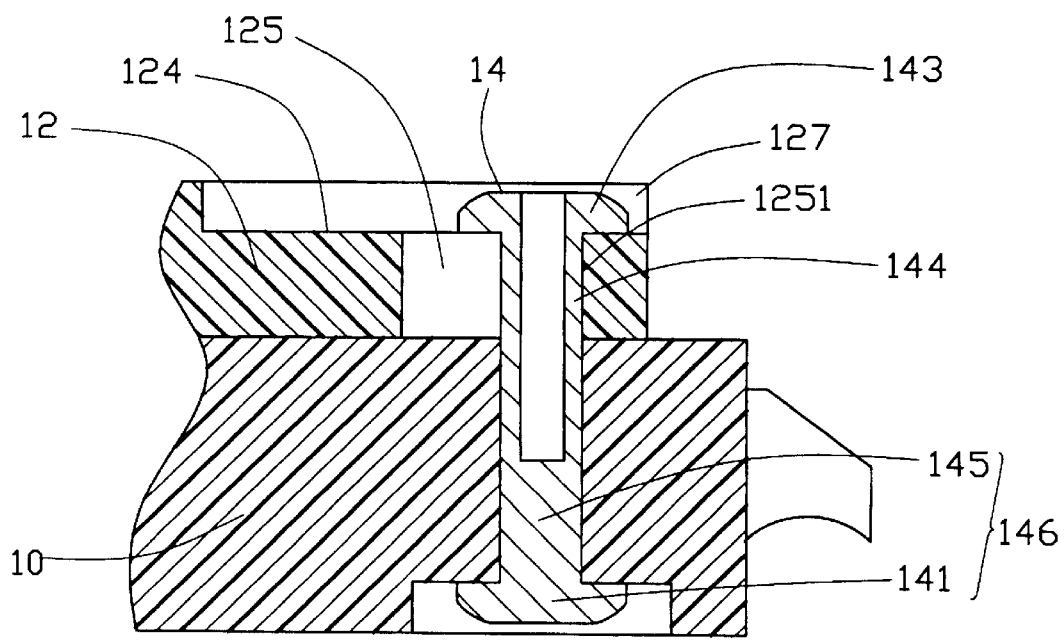
FIG. 6 is a partial, enlarged, cross-sectional view of the ZIF socket taken along line 6—6 of FIG. 5.

Referring to FIGS. 5 and 6, when the handle 202 of the lever 20 rotates to a horizontal position, that is, the ZIF socket is in a closed state, the head portion 143 of the round pin 14 moves forwardly along the supporting surface 124 in the cutout 127 relative to the cover 12, and the neck portion 144 is moved to engage with a front inner side 1251 of the elongated hole 125. It can be understood that the head portions 143 also prevent the cover 12 from upwardly disengaging from the base 10 when the cover 12 moves rearwards on the base 10 to the closed state.

Figure 7:
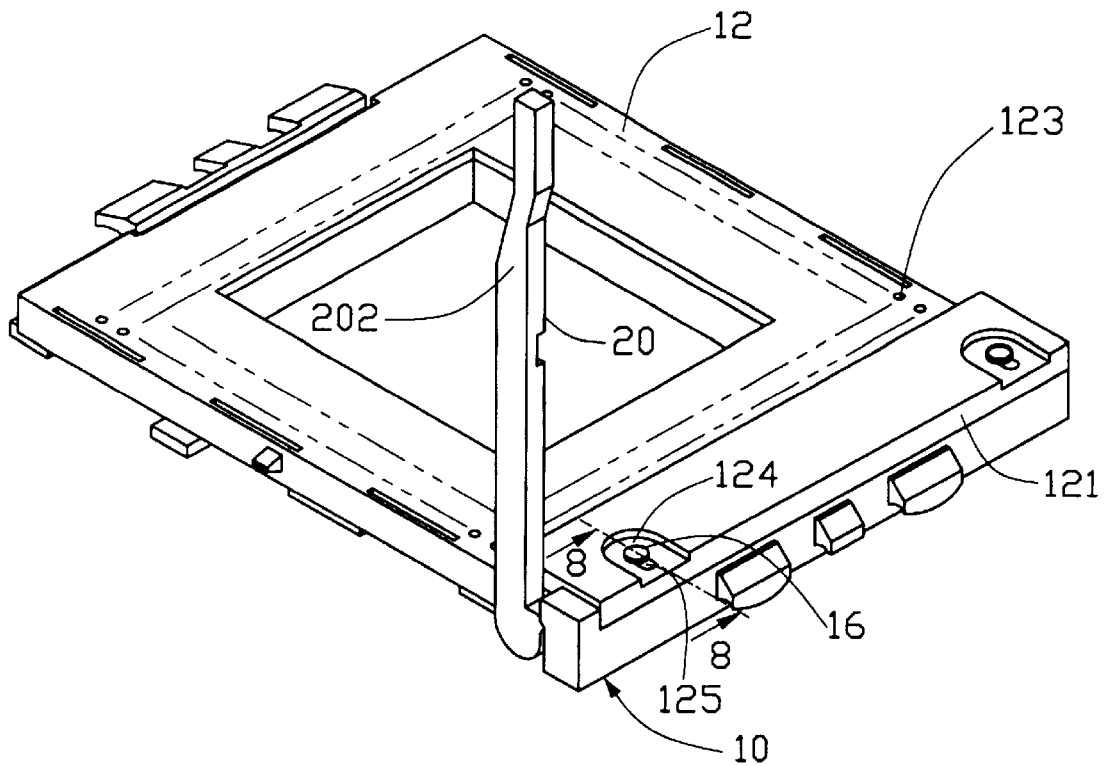
FIG. 7 is an assembled perspective view of a ZIF socket in accordance with a second embodiment of the present invention wherein the ZIF socket is in an open state.
Figure 8:
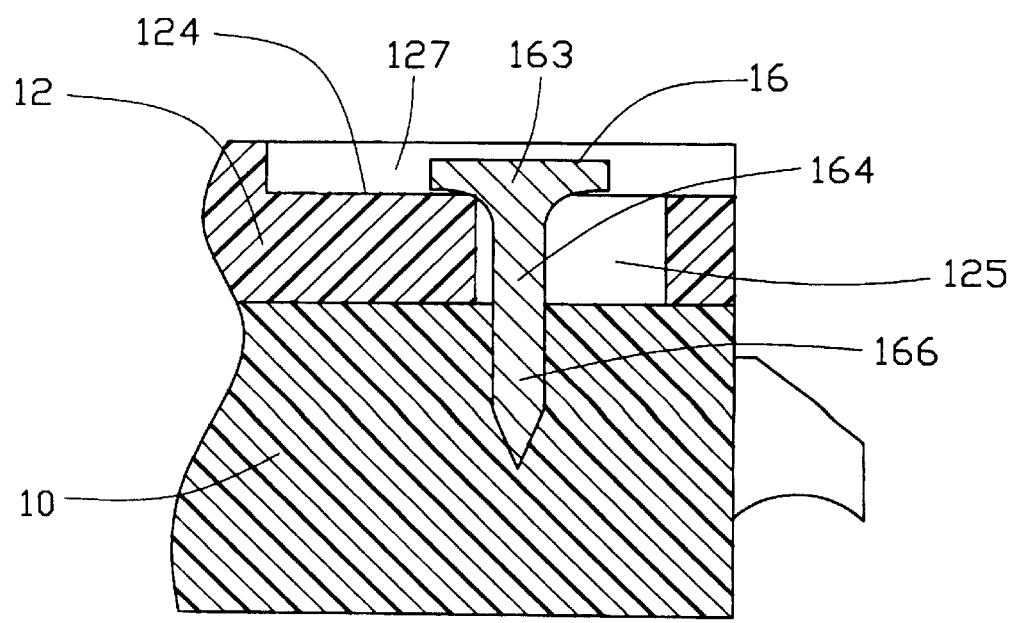
FIG. 8 is a partial, enlarged, cross-sectional view of the ZIF socket taken along line 8—8 of FIG. 7.

Referring to FIGS. 7 and 8, which represents a second embodiment of the present invention, the pair of fastening devices in the second embodiment are configured as nails 16. An upper end of the nail 16 forms a round head portion 163 received in the cutout 127 and abutting against the supporting surface 124 of the cover 12. A lower end of the nail 16 is pinned into the base 10 an approximate distance to form a securing portion 166. The nail 16 further comprises a neck portion 164 movably received in the elongated hole 125 of the cover 12. Thus, the nail 16 secured to the base 10 tightly fixes the cover 12 on the base 10 in a vertical direction.

Figure 9:
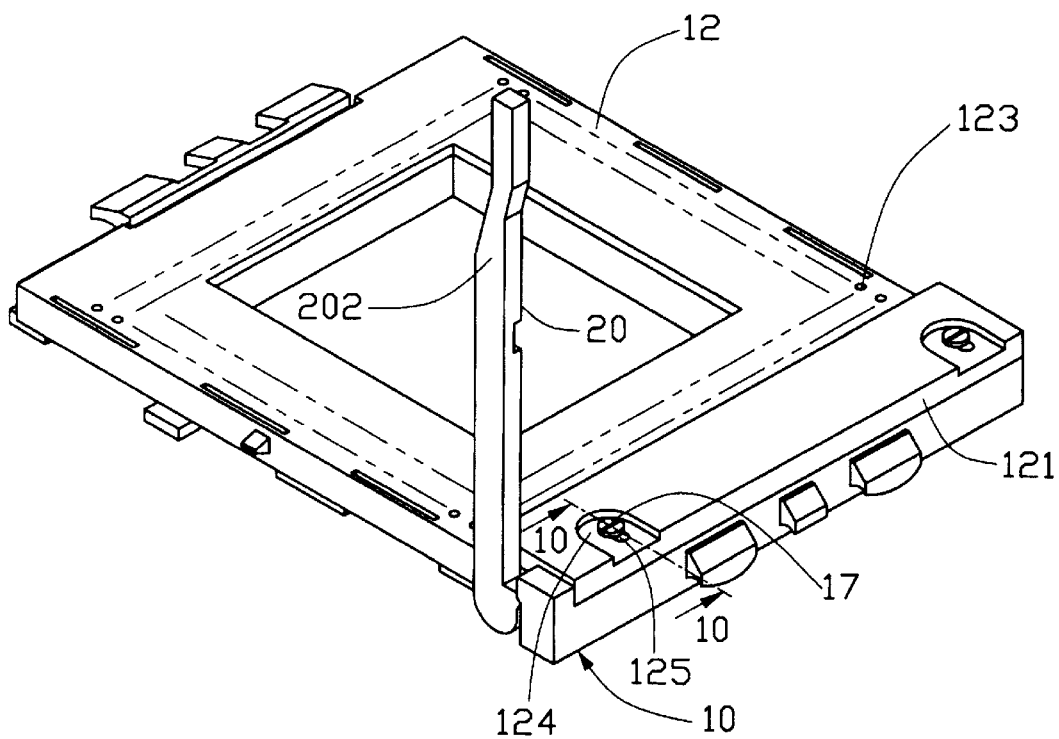
FIG. 9 is an assembled perspective view of a ZIF socket in accordance with a third embodiment of the present invention wherein the ZIF socket is in an open state.
Figure 10:
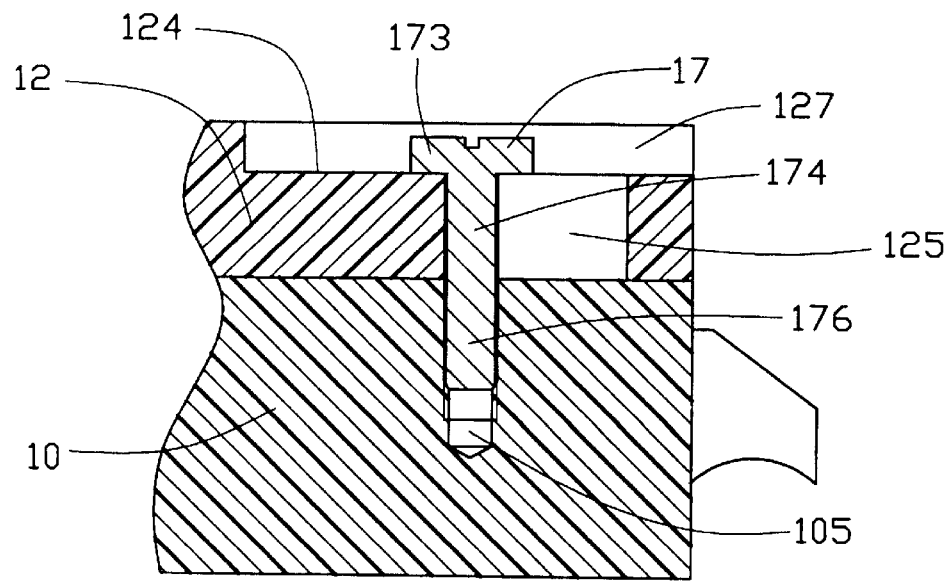
FIG. 10 is a partial, enlarged, cross-sectional view of the ZIF socket taken along line 10—10 of FIG. 9.
Figure 11:
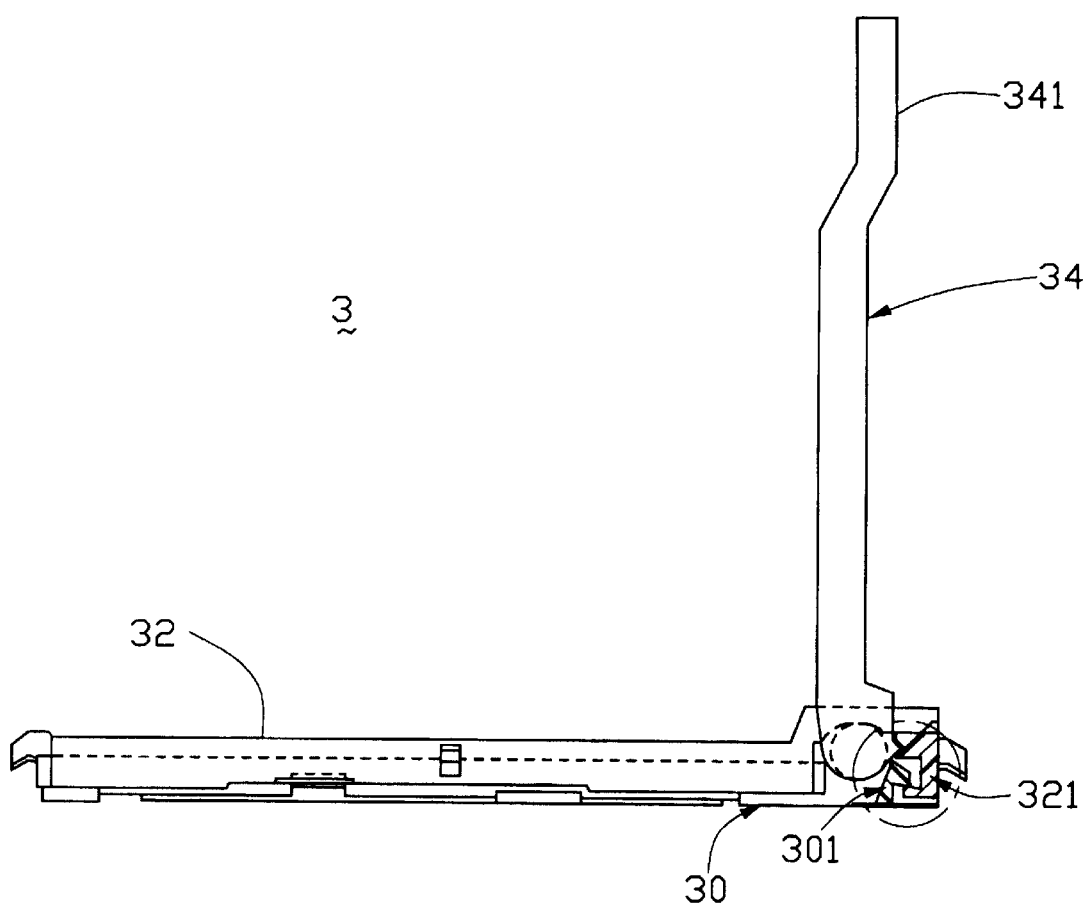
FIG. 11 is a partially cut out side view of a conventional ZIF socket in an open state.
Figure 12:
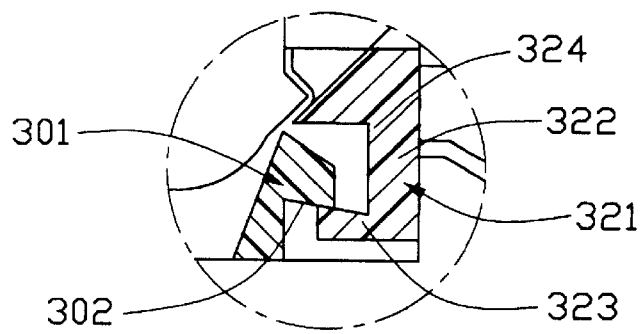
FIG. 12 is a partial, enlarged, cross-sectional view of the conventional ZIF socket shown in FIG. 11.

Referring to FIGS 9 and 10, which represents a third embodiment of the present invention, the pair of fastening devices in the third embodiment are configured as screws 17. An upper end of the screw 17 forms a slotted head portion 173 received in the cutout 127 and abutting against the supporting surface 124 of the cover 12. A lower end of the screw 17 is screwed into the base 10 to form a securing portion 176 mating with a corresponding screw hole 105 defined in the base 10 by applying a screwdriver to the slotted head portion 173. The screw 17 further comprises a neck portion 174 movably received in the elongated hole 125 of the cover 12. Thus, the screws 17 can also secure the cover 12 to the base 10 in a vertical direction.

It is easy to understand that the present invention provides a fastening device with a securing portion firmly secured to the base 10, a head portion abutting against the supporting surface 124 of the cover 12, and a neck portion movably engaging with the elongated hole 125 defined in the supporting face 124. The head portion has a dimension larger than the width of the elongated hole 125 in order to abut against and move on the supporting face 124 relative to the cover 12. Compared with the prior art, the present invention makes the engagement between the cover and the base more reliable in a vertical direction, and the assembling and manufacturing process of the ZIF socket are simplified.

It is noted that the securing portion of the fastening device of the present invention can be alternatively secured to the cover 12, and the head portion and the neck portion of the fastening device can be movably received in the base 10 accordingly. When the ZIF socket moves from an open state to a closed state or vice versa, the engaging performance of the fastening device is unchanged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF (Zero Insertion Force) socket comprising:
   a base defining a plurality of passageways extending vertically therethrough;
   a cover slidably mounted on the base;
   a plurality of terminals received in corresponding passageways of the base;
   a lever assembled between upper and lower half channels of the base and the cover for driving the cover to move along the base; and
   fastening means having a securing portion secured to one of the cover and the base, and a head portion and an intermediate neck portion movably received in the other one of the cover and the base;
   wherein the other one of the cover and the base comprises a supporting surface adjacent to the upper half channel of the cover and an elongated hole positioned in the supporting surface, the neck portion of the fastening means is movably received in the elongated hole, and the head portion of the fastening means is larger an the width of the elongated hole to movably abut against the supporting surface; wherein the cover defines a cutout in a top face thereof for receiving the head portion of the fastening means, and the supporting surface is formed at the bottom of the cutout.

2. The ZIF socket as described in claim 1, wherein the fastening means is a round pin, the securing portion of the round pin has a cap engaged with said one of the cover and the base, and the head portion of the round pin is riveted on the supporting surface of the other one of the cover and the base.

3. The ZIF socket as described in claim 1, wherein the fastening means is a nail, the securing portion of the nail is pinned into said one of the cover and the base, and the head portion of the nail is a round head abutting against the supporting surface of the other one of the cover and the base.

4. The ZIF socket as described in claim 1, wherein the fastening means is a screw, the securing portion of the screw is screwed into said one of the cover and the base, and the head portion of the screw is a slotted head abutting against the supporting surface of the other one of the cover and the base.

5. A ZIF socket comprising:

a base defining a plurality of passageways therein;

a plurality of terminals received in said passageways, respectively;

a cover mounted upon the base and being moveable along a front-to-back direction;

a lever mounted in rear portions of both said base and said cover;

a discrete fastening pin positioned around said rear portions of said base and said cover, and extending vertically in both said base and said cover with means constantly pressing one of said base and said cover against the other, for assuring said cover and said base result in no relative movement in a vertical direction when said cover is moved along the front-to-back direction relative to the base; wherein one of said base and said cover defines a cutout having a supporting surface therein, an elongated hole is positioned in the supporting surface for allowing a column of said fastening pin to move therealong when said cover is moved relative to the base along said front-to-back direction, while the other defines a compliant hole compliantly receiving said column therein for assuring no relative movement between the fastening pin and said compliant hole along said front-to-back direction; wherein said fastening pin extends through both said base and said cover; wherein said elongated hole is formed in the cover and the compliant hole is formed in the base.

* * * * *